United States Patent [19]

Harada

[11] Patent Number: 5,117,392
[45] Date of Patent: May 26, 1992

[54] NON-VOLATILE SEMICONDUCTOR MEMORY DEVICE
[75] Inventor: Teruhiro Harada, Tokyo, Japan
[73] Assignee: Oki Electric Industry Co., Ltd., Japan
[21] Appl. No.: 608,226
[22] Filed: Nov. 2, 1990
[30] Foreign Application Priority Data Nov. 2, 1989 [JP] Japan ................................. 1-286600

[51] Int. Cl.$^5$ ............................................... G11C 7/00
[52] U.S. Cl. ............................ 365/189.09; 365/185;
365/189.07; 365/203; 365/226
[58] Field of Search ............. 365/185, 189.09, 189.07,
365/189.11, 226, 203

[56]  References Cited
U.S. PATENT DOCUMENTS 5,031,148  7/1991  Kitazawa et al. ............... 365/189.09

Primary Examiner—Joseph E. Clawson, Jr.
Attorney, Agent, or Firm—Edward D. Manzo

[57] ABSTRACT

In a non-volatile memory device comprising a memory matrix having semiconductor memory cells arranged in rows and columns, a plurality of word lines are connected to the control gates of the semiconductor memory cells arranged in the rows and selected by a row decoder, a plurality of bit lines are connected to the sources of the semiconductor memory cells arranged in the columns and selected by a column decoder. Data lines are connected to the drains of a plurality of the semiconductor memory cells. A constant voltage application/current detect circuit applies a constant voltage to the drains of the semiconductor memory cells through the data line, and etects the current required to maintain the data line at the constant voltage.

9 Claims, 5 Drawing Sheets

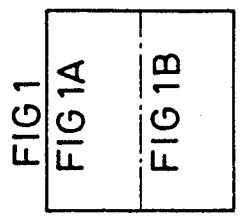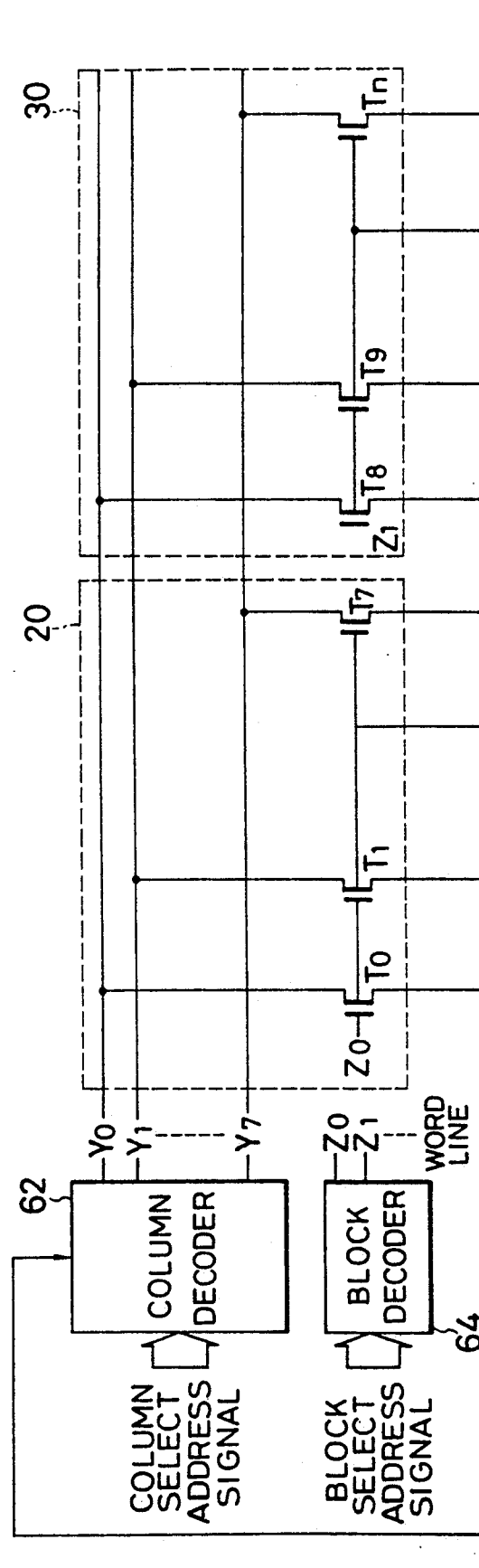

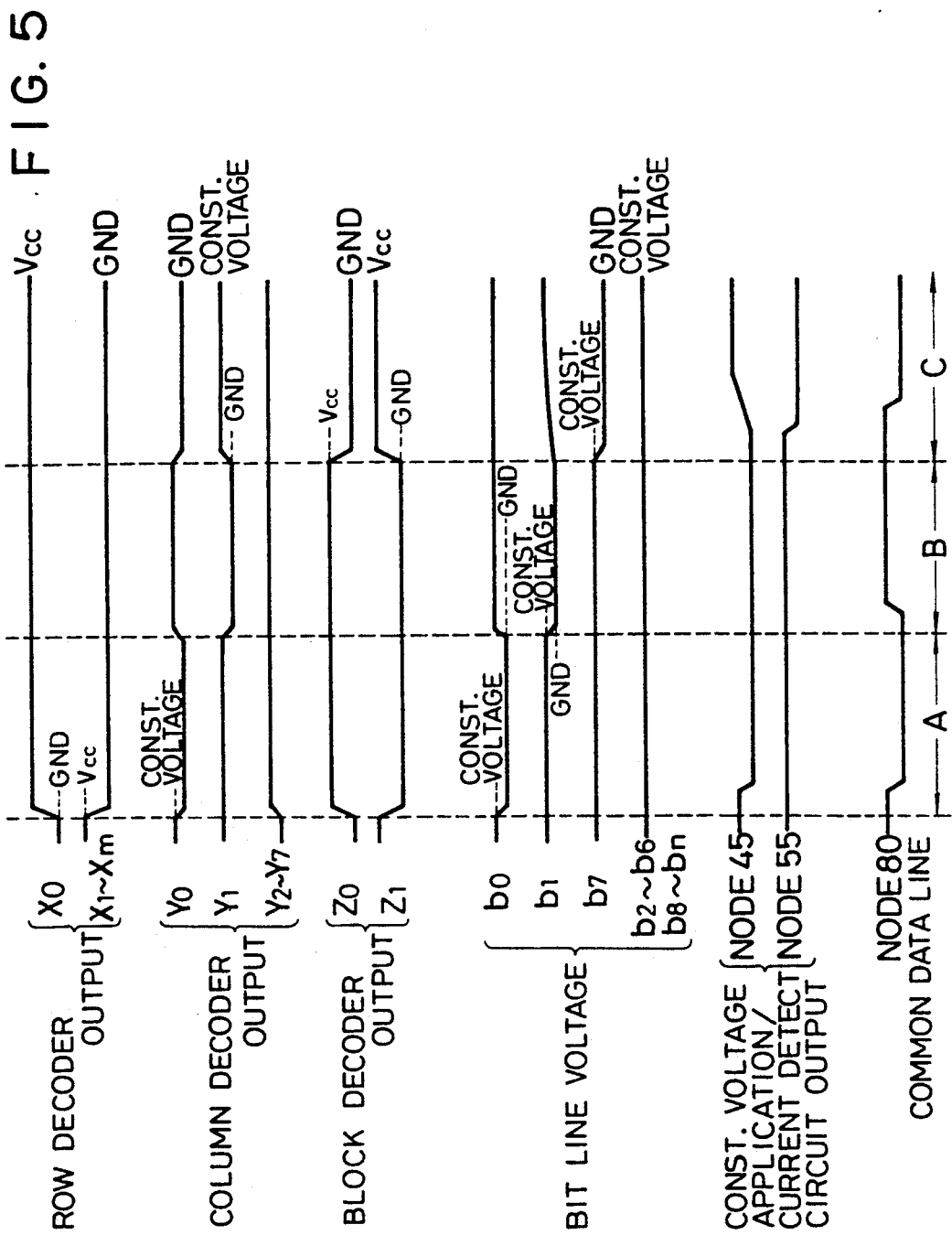

5,117,392

NON-VOLATILE SEMICONDUCTOR MEMORY DEVICE

FIELD OF THE INVENTION

The present invention relates to a non-volatile memory device, and particularly to a data read circuit therefor.

BACKGROUND OF THE INVENTION

An EPROM (electrically programmable read-only memory) for use in reading only and having silicon gates known in the art is a NOR-type memory cell array shown for example in Japanese Patent Application Kokai Publication No. 40698/1987.

FIG. 2 shows a circuit diagram of a non-volatile memory device of this type. In the figure, 1 is a column decoder, 2 is a row decoder, 3 is a sense amplifier, $T_{c0}$, $T_{c1}$, ..., $T_{cn}$ are column select transistors (hereinafter referred to as Y gates), $Q_{00}$, $Q_{01}$, ..., $Q_{mn}$ are memory cells each comprised of a transistor. Transistors Q are arrayed in rows and columns. $Y_0$ to $Y_n$ are Y gate select signals, $X_0$ to $X_m$ are word lines for supplying the output signals of the row decoder 2 to the memory gates as select signals. A plurality of bit lines $b_0 ... b_n$ are shown in FIG. 2 orthogonal to the rows (word lines).

With the above non-volatile memory device, the column decoder circuit 1 activates one of the Y gate select signals $Y_0$ to $Y_n$ thereby to actuate one of the column select transistors to couple the corresponding one of the bit lines $b_0$ to $b_n$, to sense amplifier 3. The row decoder 2 similarly selects one of the word lines $X_0$ to $X_m$. In this way, a memory cell at the intersection is selected and the sense amplifier converts the current of the memory cell into a voltage and amplifies it. Reading is thereby achieved.

However, with the above described prior art device, the source electrodes are connected to a common GND conductor, so that when one of the word lines $X_0$ to $X_m$ is selected at the time of data reading, the electric charges of the unselected bit lines are discharged to the common GND conductor through the unselected memory cells connected to the selected word line, and the potentials on the unselected bit lines are brought to the GND potential. When the data in the memory cells are read by switching the Y gates, the bit lines which are at the GND potential must first be precharged, i.e. charged to a level near the sense potential of 1.3 V, before the sense current is detected. Thus, normal reading operation is not achieved immediately, and reading takes time.

In addition, with this configuration, the voltage amplitude which appears on the bit lines due to the on-resistance of the Y gate and the voltage drop due to the memory cell current retards the data reading. That is, the on-resistance of the Y gate is normally in the order of 1 kΩ, and the current amplitude dependent on the data in the memory cell is 0 to 60 μA, so a voltage of about 60 mV is impressed on the bit line. As the voltage amplitude becomes larger, the time taken for the charge and discharge of the parasitic capacitance is longer. As a result, the data reading is retarded. This problem may be seen to be solved if the on-resistance of the Y gate is reduced. However, with a lower on-resistance of the Y gate, the load for the column decoder is heavier, and the rise time and the fall time of the column decoder output are longer, and the operation is not speedy.

SUMMARY OF THE INVENTION

The present invention has been accomplished to solve the above problems of the prior art, and its object is to provide a non-volatile memory device which permits high-speed data reading.

The non-volatile semiconductor memory device according to the present invention comprises:

a memory matrix having semiconductor memory cells arranged in rows and columns;

a plurality of word lines extending in the direction of the rows of the memory matrix and connected to the control gates of the semiconductor memory cells arranged in the rows;

a row decoder for outputting a row select signal to one of the rows of the semiconductor memory cells through the word lines;

a plurality of bit lines extending in the direction of the columns and connected to the sources of the semiconductor memory cells arranged in the columns;

a column decoder for outputting a column select signal to one of the columns of the semiconductor memory cells through said bit lines;

data lines connected to the drains of a plurality of the semiconductor memory cells; and a constant voltage application/current detecting means for applying a constant voltage to the drains of the semiconductor memory cells through said data line, and detecting the current required to maintain the data line at the constant voltage.

In the present invention, one of the rows of a plurality of word lines is selected in accordance with the row select signal from the row decoder, and one of the columns of a plurality of bit lines is selected in accordance with a column select signal, and a memory cell within the memory matrix is selected. Applied to the data line connected to the drain of the selected memory cell, is a constant voltage applied and the current supplied to the bit line through the selected memory cell to maintain the constant voltage is detected by the constant current application/current detecting means. In accordance with the magnitude of the current, the data in the selected memory cell is read. Rather than setting the source of the memory cell at the GND potential and using the drain as the data line, the constant voltage is applied, with the source of the memory cell being used the bit line, and the drain as the data line, and the data reading is effected by means of the current detecting means with the bit line being set at the selected and set at the GND potential. Accordingly, charging of the bit line from the GND potential to a level near the sense potential at the time of the switching the bit line is no longer required. In addition, the delay due to the on-resistance of the column select transistor is eliminated, so the speed of the data reading operation is increased.

BRIEF DESCRIPTION OF THE DRAWINGS

FIG. 5 is a signal waveform diagram showing the operation of the present embodiment.

DETAILED DESCRIPTION OF THE PREFERRED EMBODIMENTS

An embodiment of the invention will now be described with reference to the drawings.

Figure 1B:
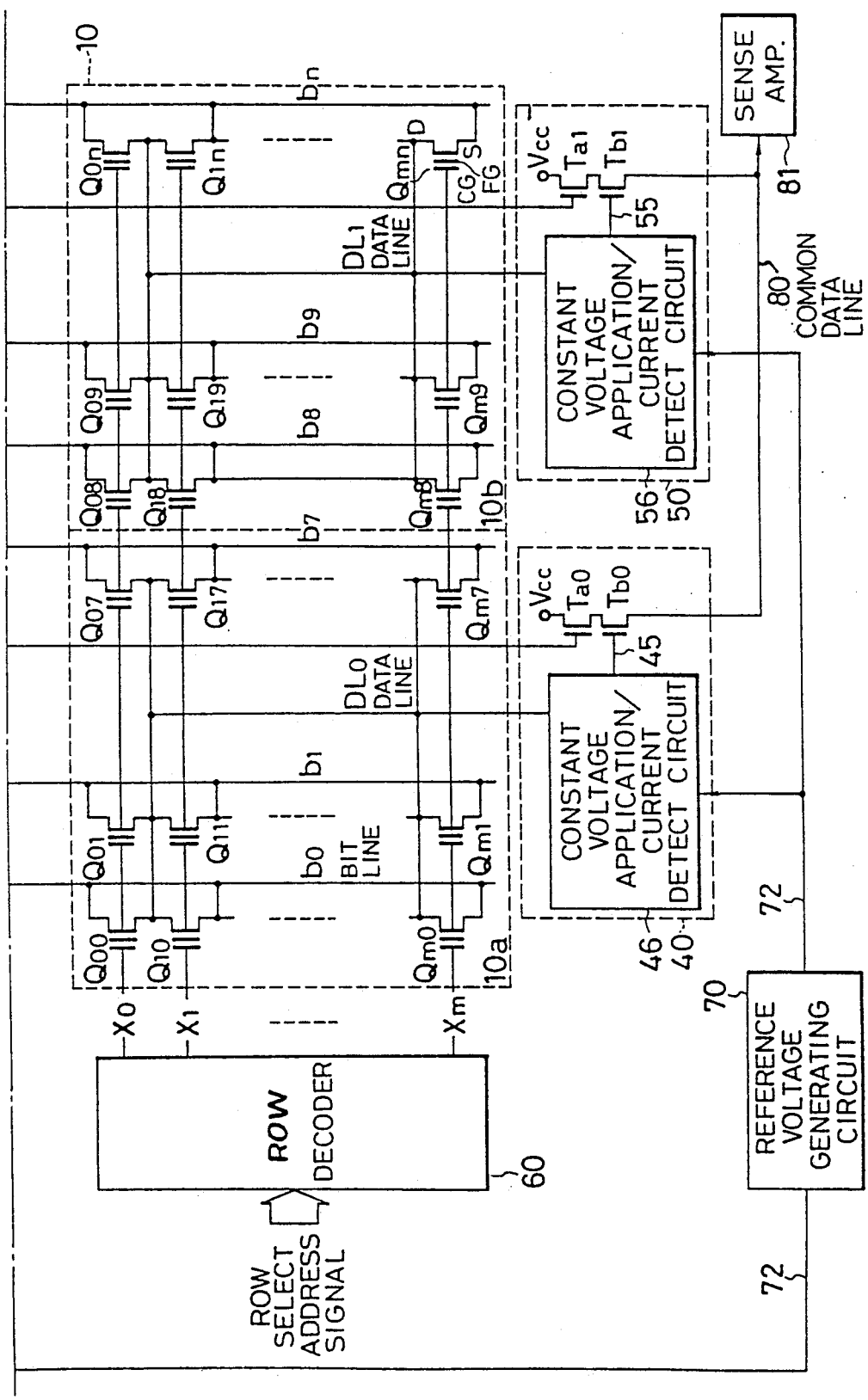
FIG. 1 is a circuit diagram showing an embodiment of non-volatile semiconductor memory device according to the invention.

FIG. 1 is a circuit diagram showing an embodiment of data reading circuit for an EPROM which is a nonvolatile memory device according to the invention.

In the figure, 10 is a memory matrix of m rows by n columns. The memory matrix 10 comprises memory cells $Q_{00}$ to $Q_{m7}$, $Q_{08}$ to $Q_{mn}$ each comprising a floating-gate avalanche injection MOS FET having a floating gate, a control gate, a source and a drain. The memory matrix further comprises word lines $X_0$ to $X_m$, bit lines $b_0$ to $b_7$, $b_8$ to $b_n$, and data lines $D_{L0}$ and $D_{L1}$. The memory cells $Q_{00}$ to $Q_{m7}$, $Q_{08}$ to $Q_{mn}$ each have a source S, a drain D, a floating gate FG and a control gate CG, as illustrated with respect to $Q_{mn}$ in the figure. Of the memory cell $Q_{mn}$, the source S is connected to the bit line $b_n$, the drain D is connected to the data line $D_{L1}$, and the control gate CG is connected to the word line $X_m$. The connection of other memory cells is similar. The data in the memory cell is determined from presence or absence of excessive electrons in the floating gate of the memory cell.

During the actual reading of data from the memory cells, the control gate voltage is set at Vcc (5 V), the source voltage is set at the GND voltage (0 V), and the drain is given a positive potential of about 1.3 V. If no excessive electrons are present in the floating gate, a current of about 60 $\mu$A flows through the drain-source circuit. If excessive electrons are present in the floating gate, the current through the drain-source circuit is suppressed to be not more than 20 $\mu$A. By detecting the current, the data can be read. The positive potential applied to the drain is about 1.3 V, which is determined to be sufficiently lower than 3.2 V, considering the fact that the energy level difference of 3.2 eV between the conduction band of silicon and the conduction band of the oxide film, so as not to cause injection of electrons into the floating gate due to the current through the source-drain current during data reading. The voltage given to the word line is at the GND potential when unselected, and is Vcc when selected.

The memory matrix 10 of the present embodiment consists of a first and a second blocks 10a and 10b. The first block 10a comprises the data line $D_{L0}$, the bit lines $b_0$ to $b_7$, and the memory cells $Q_{00}$ to $Q_{m7}$ having their drains connected to the data line $D_{L0}$ and their sources connected to the bit lines $b_0$ to $b_7$. The second block 10b comprises the data line $D_{L1}$, the bit lines $b_8$ to $b_n$, and the memory cells $Q_{08}$ to $Q_{mn}$ having their drains connected to the data line $D_{L1}$ and their sources connected to the bit lines $b_8$ to $b_n$. Either of the blocks is selected, and data in a memory cell in the selected block is read.

The data line is fixed at a predetermined constant voltage of about 1.3 V. The bit line in the selected block is fixed at the constant voltage when not selected, and is a GND voltage when selected. The bit line in the unselected block is set at an arbitrary voltage between the constant voltage and the GND voltage.

A column select circuit 20 is provided for the first block 10a of the memory matrix 10. The column select circuit 20 comprises the bit lines $b_0$ to $b_7$, signal lines extending in the direction of the rows in the memory matrix 10 and transmitting the column select signal $Y_0$ to $Y_7$ to the bit lines $b_0$ to $b_7$, and NMOS transistors $T_0$ to $T_7$ having source-drain paths connected in series with the bit lines $b_0$ to $b_7$. The gates of the NMOS transistors $T_0$ to $T_7$ are all connected together to a first block select signal line (not numbered). When the GND potential is applied as a non-select signal to an output $Z_0$ of the block decoder 64, the MOS transistors $T_0$ to $T_7$ are turned off, and the bit lines $b_0$ to $b_7$ and the column select signals $Y_0$ to $Y_7$ are electrically disconnected from each other.

A similar column select circuit 30 is provided for the second block 10b of the memory matrix 10. The column select circuit 30 comprises the bit lines $b_8$ to $b_n$, signal lines for transmitting the column select signals $Y_0$ to $Y_7$ to the bit lines $b_8$ to $b_n$, and NMOS transistors $T_8$ to $T_n$. The gates of the NMOS transistors $T_8$ to $T_n$ are all connected together to a second block select signal line (not numbered).

A current-to-voltage converter circuit (current detect means) 40 is provided for converting the current flowing through the first data line $D_{L0}$ of block 10a into a voltage. The current-to-voltage converter circuit 40 comprises a constant voltage application/current detect circuit 46, a switching NMOS transistor $T_{a0}$, and a voltage transmission NMOS transistor $T_{b0}$. The current-to-voltage converter circuit 40 converts the current to a voltage to detect the current value, and also functions as a constant voltage application means for applying a constant voltage to the data line $D_{L0}$. That is, when the first block 10a is selected, the current-to-voltage converter circuit 40 applies a voltage to maintain the selected data line $D_{L0}$ at the constant voltage, and detects the current which flows from the data line through the memory cell to the bit line (the bit line being selected is at the GND potential while the bit lines being unselected are at the constant potential), and converts the current value into a voltage value and transmits it to the common data line 80.

The internal function of the current-to-voltage converter circuit 40 is as follows: The constant voltage application/current detect circuit 46 receives the constant voltage from the reference voltage generating circuit 70, and functions to maintain the data line $D_{L0}$ at a constant voltage. It supplies the data line $D_{L0}$ with a current in an amount identical to the amount of the current which flows out of the data line, to the selected memory cell, and converts the current amount into the voltage amount and outputs it from the output terminal 45. The NMOS transistors $T_{a0}$, $T_{b0}$ are serially connected between the power supply terminal Vcc and the common data line 80, and the gate of the NMOS transistor $T_{a0}$ is connected to the block select signal $Z_0$, and the gate of the NMOS transistor $T_{b0}$ is connected to the output terminal 45 of the constant voltage application/current detect circuit 46.

When the first block 10a is selected and the NMOS transistor $T_{a0}$ is conductive, a voltage corresponding to the voltage output at the output terminal 45 is transmitted to the common data line 80. When the NMOS transistor $T_{a0}$ is nonconductive, the voltage on the output terminal 45 does not affect the common data line 80. The common data line 80 discharges a current to the GND terminal through a circuit, not illustrated.

A current-to-voltage converter circuit 50 similar to converter circuit 40 is provided for converting the current flowing to the second data line $D_{L1}$ of block 10b, into a voltage. This current-to-voltage converter circuit 50 comprises a constant voltage application/current detect circuit 56, a switching NMOS transistor $T_{a1}$, and a voltage transmitting NMOS transistor $T_{b1}$. The current-to-voltage converter circuit 50 converts the current to the voltage to detect the current value, and also functions as a constant voltage application means which applies a constant voltage to the data line $D_{L1}$. The current-to-voltage converter circuit 50 is similar to the circuit of the current-to-voltage converter circuit 40, and its function is identical to that of the current-to-voltage converter circuit 40. The common data line 80 is connected to a sense amplifier 81, and the input voltage is amplified to have the same amplitude as the logic signals in the integrated circuit.

A row decoder 60 receives a row address signal, and selects one of the word lines $X_0$ to $X_n$ and applies a voltage Vcc to the selected word line.

A column decoder 62 receives the column address signal and a constant voltage, and outputs a constant voltage to the unselected bit lines and the GND voltage to a selected one of the bit lines.

A reference voltage generating circuit 70 outputs a reference voltage (constant voltage) at the output terminal 72. The reference voltage generating circuit 70 is so designed that the value of the output voltage does not fluctuate even when noises appear in the power supply voltage. The wiring conductor connected to the output terminal 72 is preferably shielded by other wiring conductors to prevent the effect of noises from the outside and due to potential fluctuation in other wiring conductors in the integrated circuit. For example, in the case of a polysilicon wiring conductor, an aluminum layer and the substrate can be used for the shield.

The reason why the reference voltage generator circuit 70 is used for the generation of the bit line voltage by the column decoder 62 and the data line voltage by the constant voltage application/current detect circuit 46, is to prevent the constant voltages on the bit lines and the data lines from becoming uneven due to variations in the transistor characteristics that may occur if constant voltage generating transistors are separately provided for the data lines and the bit lines in the integrated circuit. By using the reference voltage generator circuit 70, all the bit lines other than the selected bit line, and all the data lines in the selected block are made to have the same voltage. The source and the drain of all the unselected memory cells in the selected block will have the same voltage, and leakage currents through unselected bit lines can be prevented.

Figure 3:
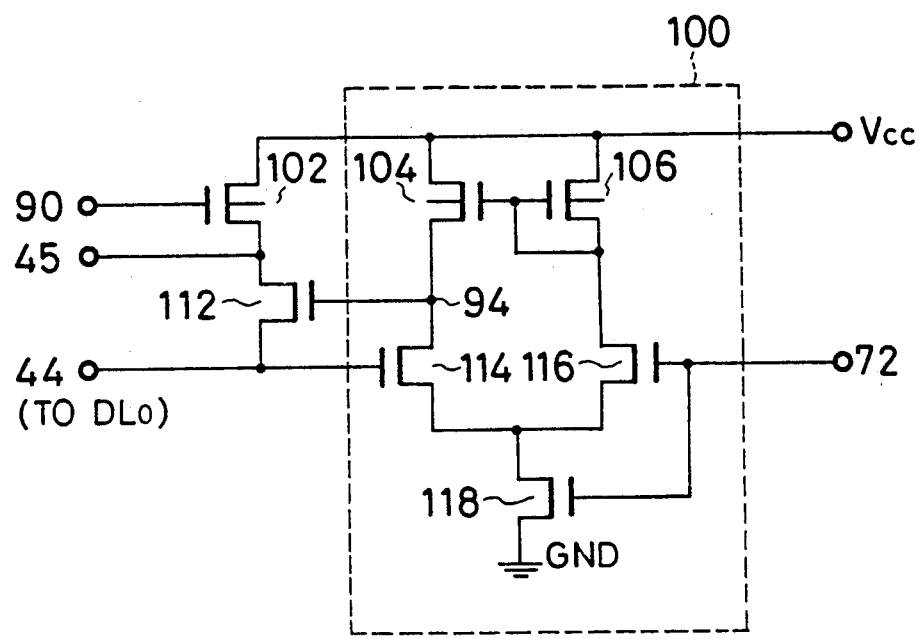
FIG. 3 is a circuit diagram of a constant voltage application/current detect circuit.

FIG. 3 is a circuit diagram showing an example of the constant voltage application/current detect circuit 46. In the figure, 100 is a differential amplifier, which comprises PMOS transistors 104 and 106, and NMOS transistors 114, 116 and 118. The reference voltage input is connected to the output terminal 72 of the reference voltage generator circuit 70, while the data line $D_{L0}$ is connected to the current input terminal 44, and its inverted output is produced at the node 94.

The source of the NMOS transistor 118 is connected to the ground (GND), and the gate is connected to the terminal 72, and the drain is connected to the sources of the NMOS transistors 114 and 116. The NMOS transistor 116 has its gate connected to the output terminal 72, and its drain connected to the gate and drain of the PMOS transistor 106. The voltage Vcc is applied to the source of the PMOS transistor 106. The voltage Vcc is applied to the source of the PMOS transistor 104. The gate of the PMOS transistor 104 is connected to the gate and drain of the PMOS transistor 106. The drain of the PMOS transistor 104 is connected to the drain of the NMOS transistor 114. The gate of the NMOS transistor 114 is connected to the data line $D_{L0}$, and its drain is connected to the node 94.

A PMOS transistor 102 is provided for converting the current to a voltage, and the voltage Vcc is applied to its source. The drain of the PMOS transistor 102 is connected to the drain of an NMOS transistor 112 and the voltage output terminal 45. The gate of the PMOS transistor 102 is connected to the terminal 90. The gate of the NMOS transistor 112 is connected to the node 94 of the differential amplifier 100, and its source is connected to the data line $D_{L0}$, and the NMOS transistor 112 controls the supply current value for maintaining the constant voltage on the data line $D_{L0}$.

The operation of FIG. 3 will now be described.

The differential amplifier 100 compares the voltage on the data line $D_{L0}$ with the reference voltage on the node 72, and supplies the inversion of the output on the data line $D_{L0}$ via the node 94 to the gate of the NMOS transistor 112. Thus, a negative feedback is formed by the transistors 114, 112, and 104. The data line $D_{L0}$ is thereby controlled to have the same value as the reference voltage on the output terminal 72. The data line $D_{L0}$ has a current path only to the bit line of the GND voltage through the memory cell, so the current supply needs to be made from the voltage Vcc only. The current flowing through the NMOS transistor 112 all flows through the PMOS transistor 102. The resistance of the PMOS transistor 102 can be arbitrarily determined depending on the channel width, the channel length, and the gate voltage given from the terminal 90. On the basis of this resistance and the current flowing through the NMOS transistor 112, the voltage difference between the voltage of the output terminal 45 and the voltage Vcc, i.e., the output amplitude is determined.

Figure 4:
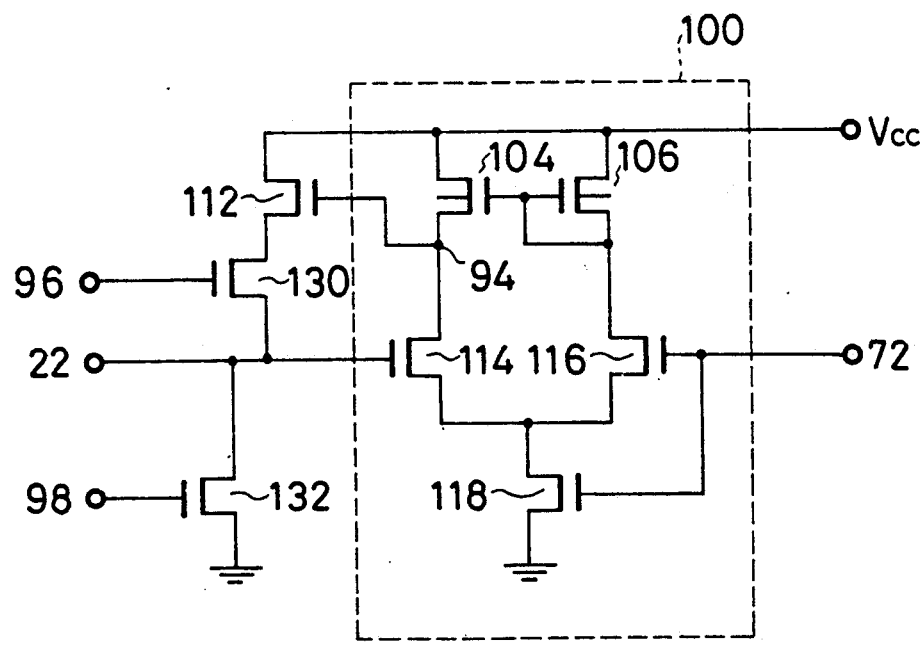
FIG. 4 is a circuit diagram showing a signal output circuit section of the column decoder.

FIG. 4 is a circuit diagram showing a signal output circuit of the column decoder 62. The circuit shown in FIG. 4 is provided for each of the column select signal $Y_0$ to $Y_7$. This circuit has a similar configuration to that of FIG. 3, and identical parts are given identical reference marks.

A differential amplifier 100 receives a reference voltage from the node 72 and outputs a voltage at a terminal 22, and outputs its inversion at a node 94. The NMOS transistors 112 and 130 are connected in series between the Vcc voltage terminal and the output terminal 22, and the gate of the NMOS transistor 112 is connected to the node 94, and gate of the NMOS transisitor 130 is connected to a terminal 96. An NMOS transistor 132 has its drain connected to the output terminal 22, its source connected to the GND terminal, and its gate connected to a terminal 98. The circuit shown in FIG. 4 is provided for each of the lines of the column select signals $Y_0$ to $Y_7$. Supplied to the terminals 96 and 98 are a corresponding one of paris of complementary signals, each pair consisting of the voltage Vcc and the GND voltage from a logic decode section (not shown). The terminal 22 is connected to the corresponding one of the lines for the column select signals $Y_0$ to $Y_7$.

Operation of the column decoder 62 is explained with reference to FIG. 4.

The operation for outputting a constant voltage to the output terminal 22 is identical to that of the circuit of FIG. 3. By using a circuit similar to the circuit shown in FIG. 3, it is possible to remove unevenness of the voltages on the data line and the bit lines due to manufacturing variations in the MOS transistor characteristics. The differences from FIG. 3 are that the PMOS transistor 102 for the current detection is not provided, and that NMOS transistors 130 and 132 are added. In this configuration, by virtue of the NMOS transistors 130 and 132, the output terminal 22 can assume two values of the GND voltage and the constant voltage.

FIG. 5 is a voltage waveform diagram showing the operation of the circuit of the present embodiment. In the figure, the horizontal axis is the time axis, which is evenly divided into data read cycles A, B and C. Data are read from the memory cell $Q_{00}$ in the data read cycle A, from the memory cell $Q_{01}$ in the data read cycle B, and from the memory cell $Q_{08}$ in the data read cycle C. It is assumed that the memory cell $Q_{01}$ alone has its floating gate injected with excessive electrons, so that even when the Vcc voltage is applied to the control gate, no current flows through the drain-source circuit.

In the data read cycle A, by the functions of the row decoder 60, the word line $X_0$ is set at Vcc, the word line $X_2$ is set at the GND voltage, and by the function of the column decoder 62, the output $Y_0$ alone is set at the GND voltage, and other column select signals are kept at the constant voltage. By the function of the block decoder 64, the output $Z_0$ is set at the Vcc voltage, and the output $Z_1$ is set at the GND voltage to select the first block 10a. Then, the transistors $T_0$ to $T_7$ are turned on, and the transistors $T_8$ to $T_n$ are turned off. The signals $Y_0$ to $Y_7$ are transmitted to the bit lines $b_0$ to $b_7$, so the bit lines $b_0$ will be at the GND voltage while the bit lines $b_2$ to $b_7$ will be at the constant voltage. The data line $D_{L0}$ is also supplied with the constant voltage, and because the source voltage and the drain voltage of the memory cells $Q_{01}$ to $Q_{07}$ which are connected to the selected word line $X_0$ and which are other than the selected memory cell $Q_{00}$ are both at the constant voltage, no current flows through their drain-source circuits. The current which flows through the memory cell $Q_{00}$ is supplied through the data line $D_{L0}$ from the constant voltage application/current detect circuit 46. This current is converted into a voltage, and appears at the output terminal 45. The MOS transistor $T_{a0}$, which is ON with the Vcc voltage being applied to the gate, outputs a current corresponding to the voltage obtained by the conversion, through the transistor $T_{b0}$ to the common data line 80, and the voltage on the common data line 80 is varied.

The output $Z_1$ of the block decoder 64 is at the GND potential, so the NMOS transistors $T_{b1}$ is off, and the voltage on the output terminal 55 of the constant voltage application/current detect circuit 56 does not effect the output on the common data line 80.

Because the NMOS transistors $T_8$ to $T_n$ are off, the bit lines $b_8$ to $b_n$ of the second block 10b which is unselected do not have means for controlling the voltage, but they are at a voltage of not lower than the GND potential and not higher than the constant voltage. Accordingly, a current flows through the data line $D_{L1}$, and even where a current flows from the current detect circuit 56, since the NMOS transistor $T_{a1}$ is off, the voltage on the common data line 80 is not affected.

When the data read cycle B is entered, the column decoder 62 sets its output $Y_0$ at the constant voltage, and sets only its output $Y_1$ at the GND potential. Because the NMOS transistors $T_0$ to $T_7$ are on by virtue of the gate input signal $Z_0$ being at the Vcc potential, the bit line $b_0$ is brought to the constant voltage and the bit line $b_1$ is brought to the GND potential. Excessive charges are fully injected into the floating gate of the memory cell $Q_{01}$ and no current flows through its drain and source circuit even if it is selected. When the bit line $b_0$ is brought to the constant voltage, the memory cell $Q_{00}$ that has been selected in the read cycle A no longer permits any current to flow, so the constant voltage application/current detect circuit 40 coverts the reduction in the current of the memory cell $Q_{00}$ into the voltage amount, and supplies it to the common data line 80.

In the data read cycle C, as compared with the cycle B, the output $Y_0$ of the column decoder 62 is changed to the GND voltage, the output $Y_1$ is changed to the constant voltage, the output $Z_1$ is changed to the Vcc potential. Accordingly, the bit line $b_8$ is brought to the GND potential and the bit lines $b_9$ to $b_n$ brought to the constant voltage, and the voltage corresponding to the current flowing through the drain-source circuit of the memory cell $Q_{08}$ is outputs to the common data line 80.

Figure 2:
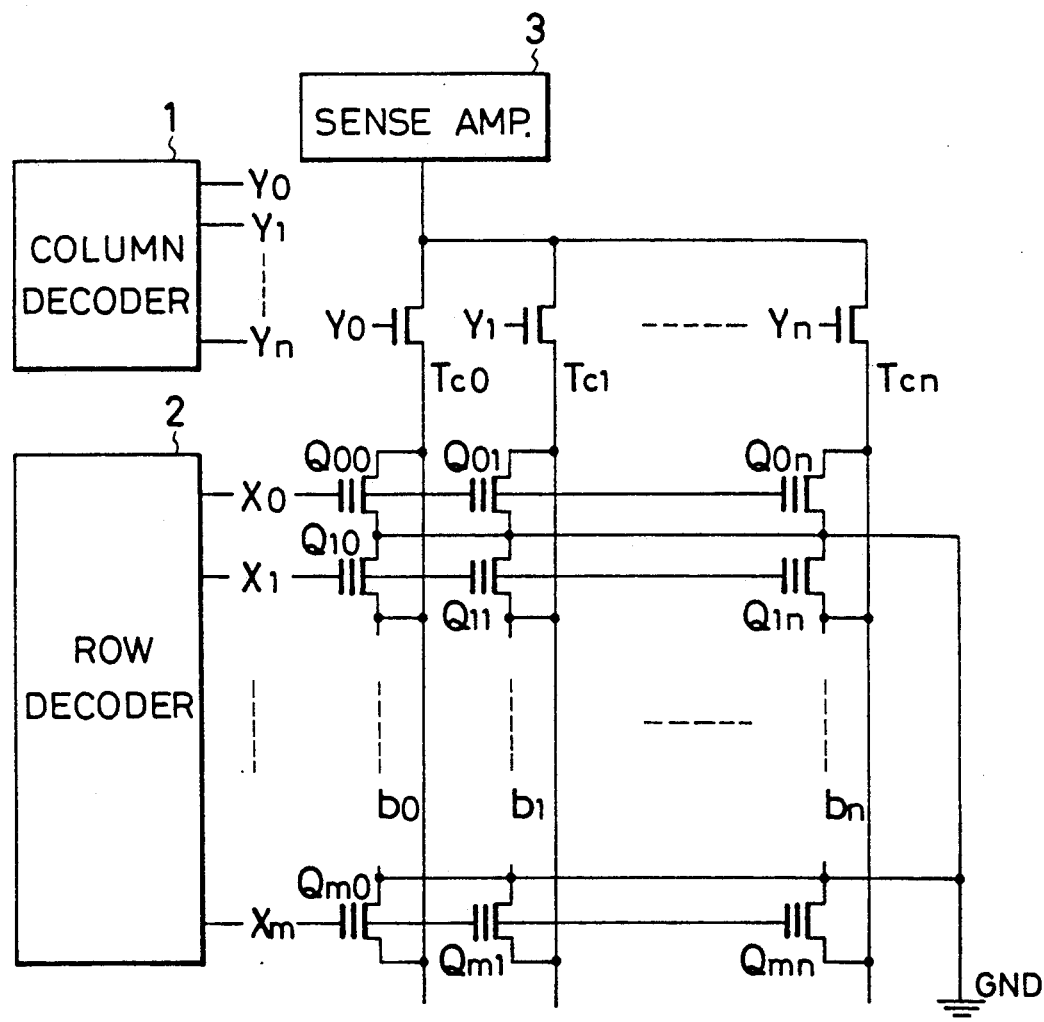
FIG. 2 is a circuit diagram of an EPROM in the prior art.

As has been described, as opposed to the prior art example of FIG. 2 in which the source of the memory cell is set at the GND potential and the drain is used as the data line, according to the present embodiment, the source of the memory cell is used as the bit line and the drain is used as the data line and connected to the constant voltage application/current detect circuit 46, and the bit line is selectively brought to the GND potential to read data. Accordingly, it is not necessary to charge, at the time of the bit line switching, the capacitance of the bit line from the GND potential to the vicinity of the sense potential, which was necessary in the prior art example. Moreover, delay due to the on-resistance of the column select transistor inherent in the prior art system is eliminated, and the speed of data reading operation is increased.

In the description of the operation of the embodiment, it was assumed that there is no potential difference between the data line and the unselected bit line. But there may actually be some minute difference. This is due to the parasitic resistance that is present because the word line and the data line extending in parallel therewith are formed on n+ diffusion layer. For instance, the first block 20 comprises eight bit lines and one data line formed of aluminum conductors, if the aluminum data line is disposed in the center of the block (four aluminum bit lines on each side), there is a resistance of about 800 Ω between the drain of the memory cell at the end and the data line. Since the current flowing through the memory cell is about 60 μ A, a potential difference of up to 50 mV appears between the drain and the source of the three unselected memory cells connected to the selected word line, that are disposed on the same side of the selected bit line with respect to the aluminum data line. However, even if the potential difference between the drain and the source of all of the three memory cells is about 50 mV, the potential difference between the drain and the source of the selected memory cell is 1.3 V, so the leakage current is less than 1/10 of the current flowing through the selected memory cell, and there is almost no effect on the read operation. Furthermore, the potential on the data line which acts as the unselected memory cell source is 1.3 V, which is higher than the GND potential, so, because of the increase in the threshold of the unselected cell due to the body effect (back-bias effect), the leakage current is smaller than that described above.

Moreover, with regard to the speed of the data reading, the time constant representing the transition time in the present embodiment as compared with the prior art system are as follows:

It is assumed that data lines are provided, one for every eight bit lines, to form the first block 10a. It is assumed tht the on-resistance of the bit line select MOS transistor in the prior art system is 1 kΩ. The capacitance of the bit lines is 2 pF per line. The time constant in the prior art system is therefore 2 msec. The voltage amplitude due to the presence or absence of the memory cell current of the constant voltage application/current detect circuit 46 of the present embodiment is determined solely by the combination of the transistors within the circuit, and is set at about 3 mV. If the current of the memory cell is 60 μA, the equivalent input resistance of the constant voltage application/current detect circuit is given by 3 mV/60 μA, which is 50 Ω. The capacitance of the data line is at most about 10 pF, so the time constant is 50 Ω × 10 pF = 0.5 msec. It is seen that the speed is much higher than in the prior art.

In the above description of the present embodiment, EPROM integrated circuit was taken as an example, but the invention is not limited to this, but can be applied to any non-volatile semiconductor memory device which selectively drive rows and columns to select the memory cells.

As has been described, according to the invention, charging of the capacitance of the bit line from the GND potential to the vicinity of the sense potential at the time of bit line switching is no longer necessary, and the inherent delay due to the on-resistance of the column select transistor in the prior art is eliminated, so the data reading speed is increased.

What is claimed is:

1. A non-volatile memory device comprising:
   a memory matrix having semiconductor memory cells arranged in rows and columns;
   a plurality of word lines extending in the direction of the rows of the memory matrix, each word line connected to the control gates of all the semiconductor memory cells arranged in the corresponding one of the rows;
   a row decoder for outputting a row select signal to one of the rows of the semiconductor memory cells through the word lines;
   a plurality of bit lines extending in the direction of the columns and connected to the sources of the semiconductor memory cells arranged in the columns;
   a column decoder for outputting a column select signal to one of the columns of the semiconductor memory cells through said bit lines;
   a data line connected to the drains of all the semiconductor memory cells, and
   a constant voltage application/current detecting means for applying a constant voltage to the drains of all the semiconductor memory cells through said data line, and detecting the current required to maintain the data line at the constant voltage.

2. The device of claim 1, wherein each of the memory cell comprises a floating-gate avalanche injection MOS FET.

3. The device of claim 1, further comprising means for detecting the data stored in the selected memory cell in accordance with the current detected by said constant voltage application/current detecting means.

4. The device of claim 3, wherein said data detecting means comprises a transistor for converting the current detected by said constant voltage application current detecting means into a voltage, and a sense amplifier for amplifying the voltage obtained by the conversion to produce a signal of a logical "1" or signal of a logical "0" depending on the magnitude of the voltage obtained by the conversion.

5. The device of claim 1, further comprising a reference voltage generating circuit for providing a reference voltage; wherein said constant voltage application/current detecting means producing said constant voltage in accordance with said reference voltage; and said column decoder produces a non-select signal of a voltage which is substantially equal in magnitude to said constant voltage, and supplies the unselected bit lines with said non-select signal.

6. The device of claim 1, wherein the memory cells in the same column have their sources connected to the same bit line, and the memory cells in the same row have their control gates connected to the same word line.

7. The device of claim 5, wherein said column decoder supplies the selected bit line with a select signal of a level which is at a first potential potential (GND).

8. The device of claim 5, wherein said row decoder supplies the unselected word lines with a non-select signal of a first level (GND), and supplies the selected word line with a select signal of a second level (Vcc).

9. A non-volatile memory device comprising:
   a memory matrix having semiconductor memory cells arranged in rows and columns, said memory matrix being divided into a plurality of clock each consisting columns which are consecutive to each other and which are not separated by a column of another block;
   a plurality of word lines extending in the direction of the rows within the clock, each word line connected to the control gates of all the semiconductor memory cells arranged in the corresponding one of the rows within the block;
   a row decoder for outputting a row select signal to one of the rows of the semiconductor memory cells through the word lines;
   a plurality of bit lines extending in the direction of the columns and connected to the sources of the semiconductor memory cells arranged in the columns;
   a column decoder for outputting a column select signal to one of the columns of the semiconductor memory cells within the block through said bit lines;
   a data line connected to the drains of all the semiconductor memory cells within the block; and
   a constant voltage application/current detecting means for applying a constant voltage to the drains of all the semiconductor memory cells within the block through said data line, and detecting the current required to maintain the data line at the constant voltage.

* * * * *